(12) United States Patent
Cho et al.

(10) Patent No.: US 10,147,583 B2
(45) Date of Patent: Dec. 4, 2018

(54) SEMICONDUCTOR PLASMA ANTENNA APPARATUS

(71) Applicant: Electronics and Telecommunications Research Institute, Daejeon (KR)

(72) Inventors: Young Kyun Cho, Daejeon (KR); Cheol Ho Kim, Daejeon (KR); Bong Hyuk Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 211 days.

(21) Appl. No.: 15/195,214

(22) Filed: Jun. 28, 2016

(65) Prior Publication Data

US 2017/0018400 A1    Jan. 19, 2017

(30) Foreign Application Priority Data

Jul. 17, 2015    (KR) .......................... 10-2015-0101880

(51) Int. Cl.
*H01J 37/147*    (2006.01)
*H01Q 19/06*    (2006.01)
*H01J 37/24*    (2006.01)

(52) U.S. Cl.
CPC .......... *H01J 37/243* (2013.01); *H01J 37/147* (2013.01)

(58) Field of Classification Search
CPC ...... H01L 29/868; H01J 37/243; H01J 37/147
USPC .............. 315/113, 185 R, 192, 193, 312, 51; 257/77, 656, 618, 499, 500, 139
See application file for complete search history.

(56) References Cited

U.S. PATENT DOCUMENTS

| | | | | |
|---|---|---|---|---|
| 5,444,454 | A * | 8/1995 | White | H01Q 3/46 342/368 |
| 6,567,046 | B2 * | 5/2003 | Taylor | H01L 29/868 257/E29.336 |
| 6,617,670 | B2 * | 9/2003 | Taylor | H01L 29/868 257/458 |
| 7,109,124 | B2 | 9/2006 | Harper | |
| 7,952,533 | B2 | 5/2011 | Hur et al. | |
| 8,564,155 | B2 | 10/2013 | Wibben | |
| 8,994,471 | B2 | 3/2015 | Ryu et al. | |

(Continued)

OTHER PUBLICATIONS

Author: Hiramatsu, Title: Light source unit and Lighting fixture, Date: Feb. 12, 2015 (Translation), Publisher:JP2016149261.*

(Continued)

*Primary Examiner* — Wei Chan
(74) *Attorney, Agent, or Firm* — Nelson Mullins Riley & Scarboroug LLP

(57) ABSTRACT

Provided is a semiconductor plasma antenna apparatus. The apparatus includes: a cell array unit in which a plurality of PIN diode cells are arranged, and in which a cell pattern is formed by using a predefined PIN diode cell among the plurality of PIN diode cells; and a driver circuit unit configured to control a drive of the predefined PIN diode cell, wherein the driver circuit unit comprises: a direct-current conversion unit equipped with a DC-DC converter configured to drive a diode load of the cell pattern by applying an output voltage to a PIN diode cell corresponding to the cell patterns formed in the cell array unit; and a constant current controller configured to controlling a plasma concentration of the PIN diode cell by controlling a constant current for the diode load of the cell pattern.

10 Claims, 7 Drawing Sheets

(56) References Cited

U.S. PATENT DOCUMENTS

| | | | | |
|---|---|---|---|---|
| 2006/0028156 A1* | 2/2006 | Jungwirth | .......... | H05B 33/0815 |
| | | | | 315/312 |
| 2009/0009266 A1* | 1/2009 | Ishiguro | ............... | H03G 1/0058 |
| | | | | 333/172 |
| 2010/0283322 A1* | 11/2010 | Wibben | ................ | H02M 3/158 |
| | | | | 307/31 |
| 2013/0229316 A1* | 9/2013 | Chen | ...................... | H01Q 23/00 |
| | | | | 343/729 |
| 2016/0242249 A1* | 8/2016 | Hiramatsu | ......... | H05B 33/0824 |

OTHER PUBLICATIONS

Fathy, Aly E. et al., "Silicon-Based Reconfigurable Antennas-Concepts, Analysis, Implementation, and Feasibility," IEEE Transactions on Microwave Theory and Techniques, vol. 51 (6):1650-1661 (Jun. 2003).

* cited by examiner

[FIG.2]
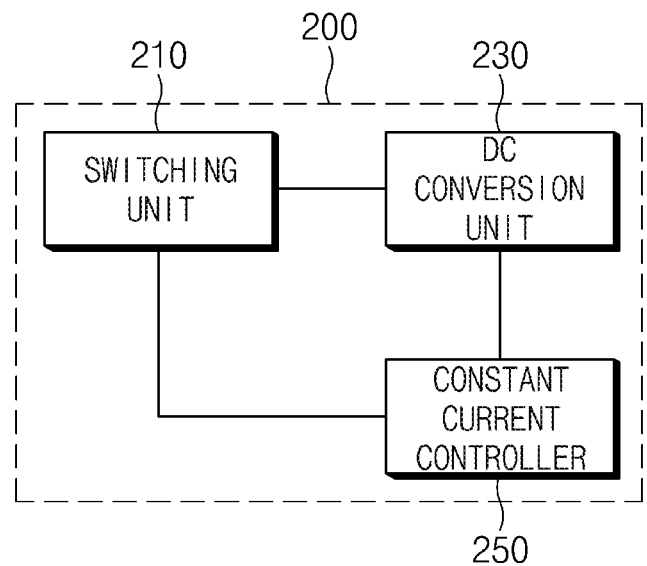

[FIG.3]
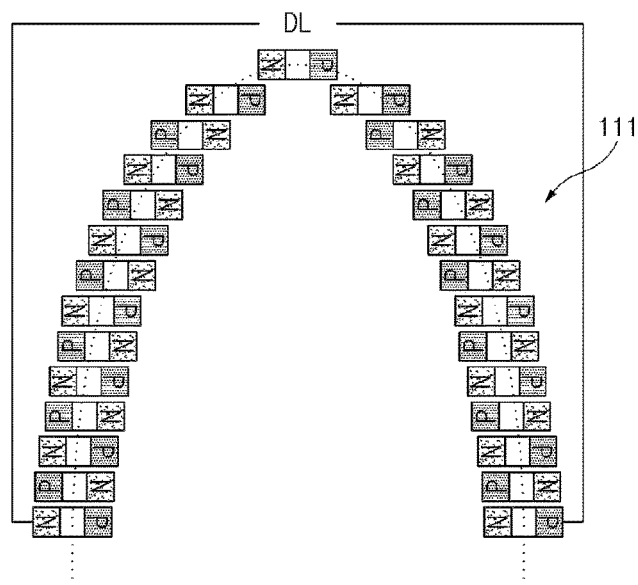
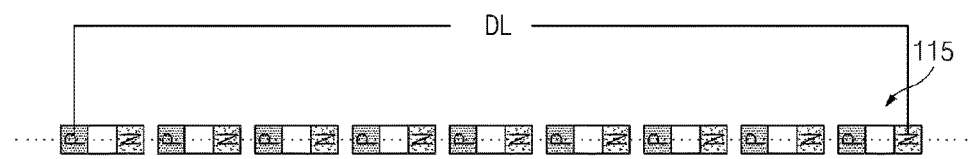

[FIG.4]
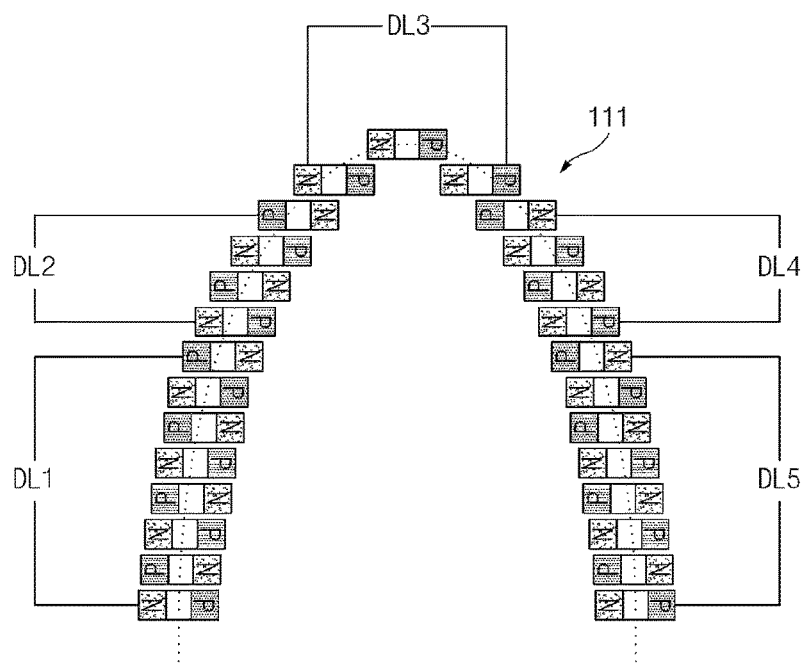

[FIG.5]
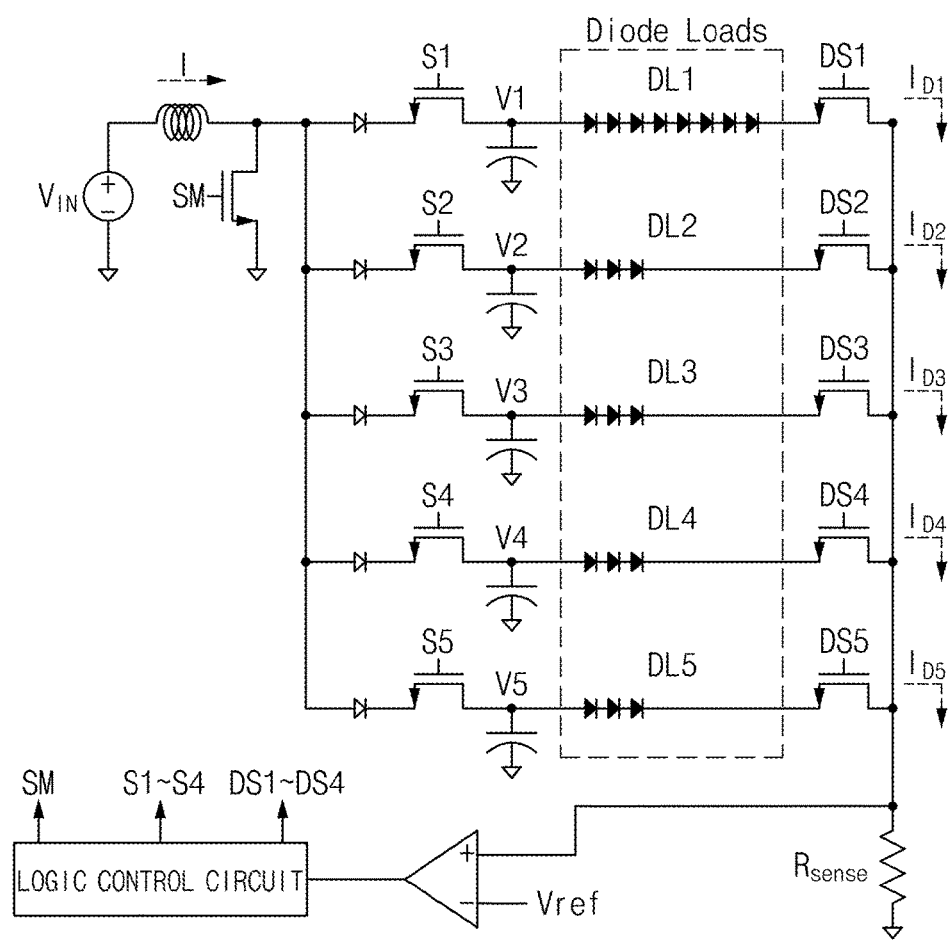

[FIG.6]
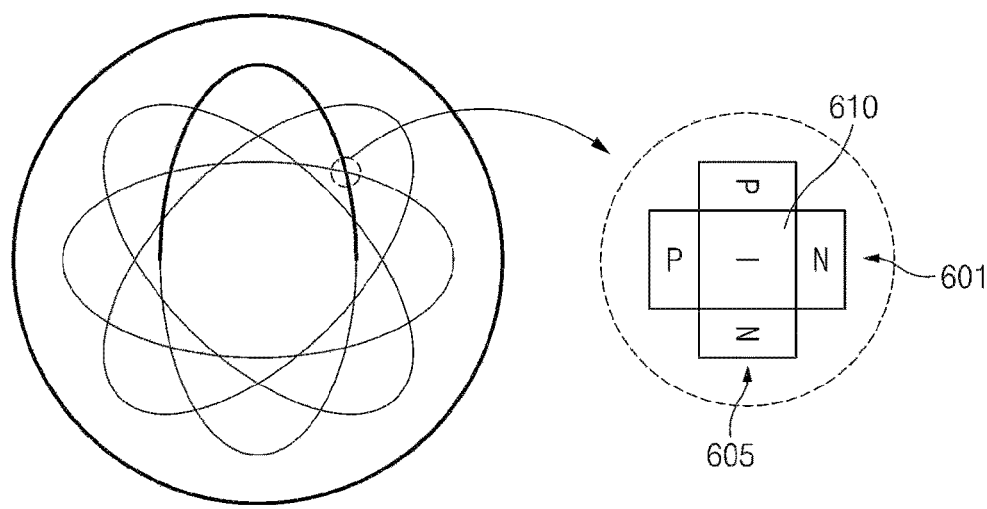

SEMICONDUCTOR PLASMA ANTENNA APPARATUS

CROSS-REFERENCE TO RELATED APPLICATION

This application claims the benefit of priority to Korean Patent Application No. 10-2015-0101880, filed on Jul. 17, 2015 in the Korean Intellectual Property Office, the disclosure of which is incorporated herein in its entirety by reference.

BACKGROUND OF THE INVENTION

Field of the Invention

The present disclosure relates to a semiconductor plasma antenna apparatus.

Description of the Related Art

A semiconductor plasma antenna requisitely requires a semiconductor plasma cell (e.g., a PIN diode) and a driver circuit that can drive the cell, so as to obtain a restructuring characteristic and a beam forming characteristic. A circuit technique for driving a semiconductor plasma antenna cell employs a method, for example, a dot matrix method, for driving a diode such as a conventional LED, However, when applying the dot matrix method so as to drive the cells of the semiconductor plasma antenna following problems occur.

First, the semiconductor plasma antenna must be able to adjust a carrier concentration of own area (intrinsic area) of a PIN diode through a constant current driving system, but the dot matrix method is unable to effectively control an amount of current because it uses a voltage driving scheme, and it is difficult to stably drive a diode cell as a lot of current may changed due to only a little voltage.

Second, the dot matrix method should connect a control switch to all diode cells. However, the semiconductor plasma antenna requires a number of routings so as to implement a connection between a control circuit and a diode cell array as it cannot configure a diode and a switch on chip.

In addition, the driver circuit has a limitation of the number of input pads when connecting all of the plurality of connection routings, and the routing that is used for the cell array is formed of metallic material to affect the properties of the semiconductor plasma antenna.

Finally, since the dot matrix method additionally requires a digital block which can control a gate and a source driver so as to configure a reconstruction pattern of the semiconductor plasma antenna cell, power consumption may be increased.

SUMMARY OF THE INVENTION

The present disclosure has been made in view of the above problems, and provides a semiconductor plasma antenna apparatus that reconfigures a cell pattern of a semiconductor plasma antenna by using a previously defined specific PIN diode cell in a cell array, and enables to drive a semiconductor plasma antenna through a driver circuit, and a driving method thereof.

In accordance with an aspect of the present disclosure, a semiconductor plasma antenna apparatus includes: a cell array unit in which a plurality of PIN diode cells are arranged, and in which a cell pattern is formed by using a predefined PIN diode cell among the plurality of PIN diode cells; and a driver circuit unit configured to control a drive of the predefined PIN diode cell, wherein the driver circuit unit comprises: a direct-current conversion unit equipped with a DC-DC converter configured to drive a diode load of the cell pattern by applying an output voltage to a PIN diode cell corresponding to the cell patterns formed in the cell array unit; and a constant current controller configured to controlling a plasma concentration of the PIN diode cell by controlling a constant current for the diode load of the cell pattern. The predefined PIN diode cell is connected in series in the cell pattern. The predefined PIN diode cell is connected in parallel in the cell pattern. When a single cell pattern is divided into multiple patterns to configure a plurality of diode loads, the number of the PIN diode cells configuring each diode load is adjusted according to a type of the DC-DC converter. The driver circuit unit further includes a switching unit that intermits a signal between the cell pattern and the direct-current conversion unit and a signal between the cell pattern and the constant current controller. When a plurality of cell patterns are formed in the cell array unit, the switching unit includes a switch corresponding to each cell pattern. When a single cell pattern is divided into multiple patterns to configure a plurality of diode loads, the switching unit includes a switch corresponding to each of the divided patterns. A length of a corresponding cell pattern is adjusted according to an operation of the switch corresponding to each of the divided patterns. The switching unit includes a logic control circuit that controls an input and output of the plurality of signals. The cell array unit includes a dummy pattern which is formed in an area excluding the cell pattern formed by using the predefined PIN diode cell. The driver circuit unit is mounted on a PCB substrate, and the cell array unit shares a ground plane of the PCB substrate.

BRIEF DESCRIPTION OF THE DRAWINGS

The objects, features and advantages of the present disclosure will be more apparent from the following detailed description in conjunction with the accompanying drawings, in which:

FIG. 2 is a diagram illustrating a detailed configuration of a driver circuit unit of FIG. 1;

FIG. 3 is a diagram illustrating a configuration of a diode load according to an embodiment of the present disclosure;

FIG. 4 is a diagram illustrating a configuration of a diode load according to another embodiment of the present disclosure;

FIG. 5 is a diagram illustrating a circuit configuration of a semiconductor plasma antenna apparatus according to an embodiment of the present disclosure;

FIG. 6 is a diagram illustrating an overlay structure of a PIN diode cell according to an embodiment of the present disclosure.

DETAILED DESCRIPTION OF EXEMPLARY EMBODIMENTS

Exemplary embodiments of the present disclosure are described with reference to the accompanying drawings in detail. The same reference numbers are used throughout the drawings to refer to the same or like parts. Detailed descriptions of well-known functions and structures incorporated herein may be omitted to avoid obscuring the subject matter of the present disclosure.

Figure 1:
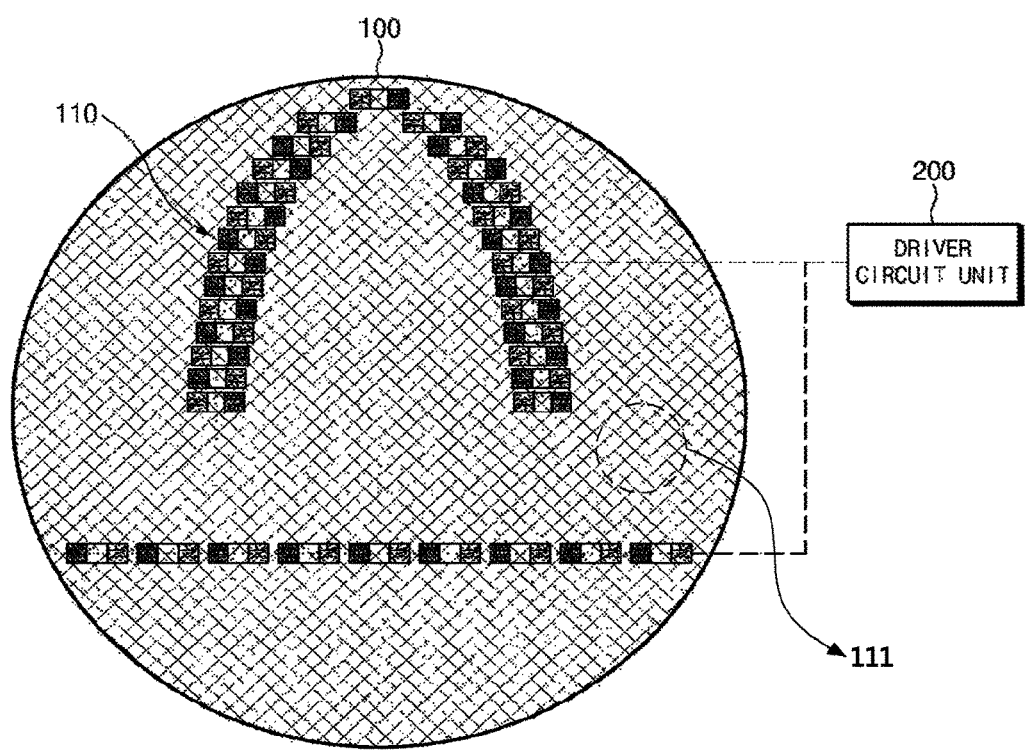
FIG. 1 is a diagram illustrating a configuration of a semiconductor plasma antenna apparatus according to the present disclosure.

FIG. 1 is a diagram illustrating a configuration of a semiconductor plasma antenna apparatus according to the present disclosure.

Referring to FIG. 1, the semiconductor plasma antenna apparatus according to the present disclosure (hereinafter referred to as "antenna apparatus") may include a cell array unit 100 and a driver circuit unit 200.

The cell array unit 100 may be implemented in the form of a plurality of unit cells, for example, in the form of arranging PIN diode cells in a two-dimension. Here, the cell array unit 100 may reconfigure a cell pattern 110 by using a predefined PIN diode cell after a specific number of PIN diode cells for forming the cell pattern 110 is predefined.

The cell array unit 100 of FIG. 1 configures a cell pattern (hereinafter referred to as "a first pattern") of parabolic shape and a cell pattern (hereinafter referred to as "a second pattern") of straight line by using a predefined PIN diode cell, but it is obvious that the shape of the cell pattern 110 which is configured by using a predefined PIN diode cell can be changed.

At this time, an area excluding a cell patterns configured by the predefined PIN diode cell in the cell array unit may be filled with a dummy pattern 111. Here, the dummy pattern 111 may be a floating node and may be connected to ground so as to prevent ill effects on the antenna.

The driver circuit unit 200 may be connected to the PIN diode cell configuring the cell pattern 110, and may control the drive of the PIN diode cell. At this time, since the driver circuit unit 200 drives only the predefined PIN diode cell, a routing for controlling a total cell of the cell array unit 100 respectively is not necessary, such that the performance of the antenna apparatus on a semiconductor substrate can be maximized, and the configuration of the driver circuit unit 200 can be simplified.

When a voltage is applied to the PIN diode cell, the diode load of the cell pattern 110 configured by the PIN diodes cells may be driven.

Therefore, a detailed configuration of the driver circuit unit 200 is described in more detail with reference to FIG. 2.

FIG. 2 is a diagram illustrating a detailed configuration of a driver circuit unit applied to a semiconductor plasma antenna apparatus according to the present disclosure.

Referring to FIG. 1, the driver circuit unit 200 may include a switching unit 210, a DC conversion unit 230, and a constant current controller 250.

A diode load of the semiconductor plasma antenna apparatus may be configured by a cell pattern of the cell array unit. For example, a single cell pattern may be configured by connecting a plurality of PIN diode cells in series, and the configured single cell pattern may be connected to the driver circuit unit 200 to configure a single diode load. In this case, the semiconductor plasma antenna is possible to accomplish a beam forming and a steering without varying frequency. Here, when two cell patterns are configured by connecting in series the predefined PIN diode cells, each cell pattern may be connected to a switch, and connected to the driver circuit unit 200 according to a switch handling. A detailed embodiment of this may refer to FIG. 3.

In the embodiment of the present disclosure, only a pattern connecting the PIN diode cells in series is illustrated, but a cell pattern may be formed by connecting the PIN diode cells in parallel depending on an embodiment. However, a detailed description of configuring a cell pattern by connecting the PIN diode cells in parallel is omitted.

As another example, the cell pattern configured by using a predefined PIN diode cell may be divided into multiple patterns, and each of the divided patterns may be connected to a DC-DC converter of the DC conversion unit 230 to configure a plurality of diode loads. In this case, each of the divided patterns may be connected to the switch, and may be connected to the DC conversion unit 230 and the constant current controller 250 according to the connected switch handling. A detailed embodiment of this may refer to FIG. 4.

The switching unit 210 may switch a signal outputted to the cell pattern configured by the PIN diode cell predefined in the cell array unit. Here, the switching unit may include a first switching unit to intermit a signal between the cell pattern and the DC conversion unit 230 and a second switch to intermit a signal between the cell pattern and a rectification controller. The first switching unit and the second switching unit may include switches of the number corresponding to the number of the cell pattern or the number of the patterns divided in the cell pattern.

As an example, when a first pattern and a second pattern are configured in the cell array unit, the first switching unit and the second switch unit may be equipped with two switches connected to the first pattern and the second pattern respectively.

When the cell pattern configured in the cell array unit is three or more, or when a single cell pattern is divided into multiple patterns to configure a plurality of diode loads, the switching unit 210 may include switches of the number corresponding to each cell pattern or each diode load. Here, when it is necessary to implement a plurality of switches, the switching unit 210 may configure a control logic circuit instead of the switch.

The DC conversion unit 230 may include a DC-DC converter. Here, the DC-DC converter may convert a voltage supplied from a voltage source to output to a predefined cell pattern so that it can control the drive of a corresponding PIN diode cell. In this case, the diode load is driven.

A single DC-DC converter may be connected in response to a single cell pattern. On the other hand, when a single cell pattern is divided to configure a plurality of diode loads, the DC-DC converter can be connected to a plurality of diode loads.

At this time, the output voltage of the DC-DC converter may be increased depending on the number of the PIN diode cells which are connected in series configuring the diode loads. Therefore, the DC-DC converter may be implemented by using a converter in the form of a boost.

Meanwhile, when configuring a plurality of diode loads, the DC-DC converter may be implemented by using various structures of converter such as a buck, a buck-boost, a boost, a single inductor multiple output (SIMO) DC-DC converter, or the like.

The constant current controller 250 may control a constant current of the diode load connected to the DC-DC converter to control the plasma density of the PIN diode cell. Here, the embodiment of the diode load may be represented as FIG. 5.

FIG. 3 is a diagram illustrating a configuration of a diode load according to an embodiment of the present disclosure.

As shown in FIG. 3, a single cell pattern may be configured by connecting a plurality of diodes in series, and an entire configured single cell pattern may be driven by a single DC-DC converter. In this case, a single diode load may be configured in response to a single cell pattern.

FIG. 3 illustrates an exemplary configuration of a two-cell pattern on a cell array unit. In this case, it is possible to drive a first pattern 111 and a second pattern 115 by a single DC-DC converter. In this case, according to a handling of switches disposed between the first pattern 111 and the DC-DC converter, and between the second pattern 115 and the DC-DC converter, the output voltage from the DC-DC converter may be applied to the PIN diode cell of the first pattern 111 and/or the second pattern 115.

Meanwhile, when configuring a single cell pattern by connecting a plurality of diodes in series, the switch may be omitted. In this case, since the entire pattern configures a single load, the semiconductor plasma antenna may configure an antenna that can accomplish a beam forming and a steering without varying a frequency.

Obviously, other cell pattern may be formed on the cell array unit by using a defined PIN diode cell in addition to a cell pattern shown in FIG. 3.

FIG. 4 is a diagram illustrating a configuration of a diode load according to another embodiment of the present disclosure.

When a cell pattern is configured in the cell array unit by using a predefined PIN diode cell, the semiconductor plasma antenna apparatus may divide the configured cell pattern into multiple patterns and connect each of the divided patterns to the DC-DC converter.

In this case, it is possible to configure diode loads of the number corresponding to each of the divided patterns.

As an example, as shown in FIG. 4, the semiconductor plasma antenna apparatus may divide the first pattern 111 into five patterns, and each of the divided five patterns may be connected to the DC-DC converter to configure five diode loads (DL1 to DL5).

In this case, each of the divided patterns may be connected to the switch, and may be connected to the DC conversion unit 230 and the constant current controller 250 according to the connected switch handling.

In addition, as shown in FIG. 4, the semiconductor plasma antenna apparatus may divide the second pattern 115 into three patterns, and each of the divided three patterns may be connected to the DC-DC converter to configure three diode loads (DL, DL1, DL2).

When the cell pattern configured in the cell array unit is three or more, or when configuring a plurality of diode loads by dividing a single cell pattern into multiple patterns, the switching unit 210 should be provided with switches of the number corresponding to each cell pattern or each diode load. However, when the number of switches to be provided is large, the cell pattern may be selected by a control logic circuit not by a switch. Here, the control logic circuit may be separately implemented in the switching unit 210, but it is also possible to use a control logic circuit of a power switch existing in the DC-DC converter.

Thus, when configuring a plurality of diode loads, frequency may vary in addition to the function of the beam forming and the steering of the semiconductor plasma antenna apparatus. In this case, the DC-DC converter may be implemented by using a converter of various structures such as a buck, a buck-boost, a boost, or the like.

However, in the case of using the DC-DC converter of the booster type, the pattern may be divided so that the number of the diodes connected in series in the cell pattern may be similar, and thus the output voltage of each of the divided patterns may be nearly constant. Obviously, in the case of applying the SIMO DC-DC converter, the number of the series-connected diodes may be freely adjusted.

FIG. 5 is a diagram illustrating a circuit configuration of a semiconductor plasma antenna apparatus applying the SIMO DC-DC converter to the embodiment of FIG. 4.

Referring to FIG. 5, the diode loads DL1, DL2, DL3, DL4, and DL5 correspond to the load diode (DL1 to DL5) configured in the first pattern of FIG. 4.

The DC-DC converter may convert the input voltage ($V_{IN}$) and may apply voltages of V1, V2, V3, V4 and V5 to each diode load DL1, DL2, DL3, DL4, and DL5. At this time, since the DC-DC converter is a converter of the SIMO type, voltages of V1 to V5 may have different values. In this case, it is possible to decide freely the number of series-connected diodes configuring each diode load.

In FIG. 5, the constant current controller may include a logic control circuit and a resistor (Rsense). At this time, the constant current controller may adjust the length of the first pattern through the control of the second switch (DS1 to DS5).

Meanwhile, the constant current controller may be a configuration replacing a first switch, and may control the turning on/off of the entire pattern. At this time, the control logic circuit may adjust the input signal of a SM switch and control a pattern to which the output voltage of the DC-DC converter is applied.

FIG. 6 illustrate a configuration of a PIN diode cell when a plurality of configured cell patterns are overlapped with each other after the plurality of cell patterns are configured by using a PIN diode cell predefined in the cell array unit.

As shown in FIG. 6, when a plurality of cell patterns configured in the cell array unit are overlapped with each other, an intrinsic area 610 of a PIN diode cell 601 configuring the first pattern, and the intrinsic area 610 of a PIN diode cell 605 configuring the second pattern may be implemented to be shared with each other.

In this case, a unit cell may be designed to share the intrinsic area of each PIN diode cell, so that the area of circuit may be reduced, and thus it is possible to solve circuit configuration and routing problems.

Figure 7:
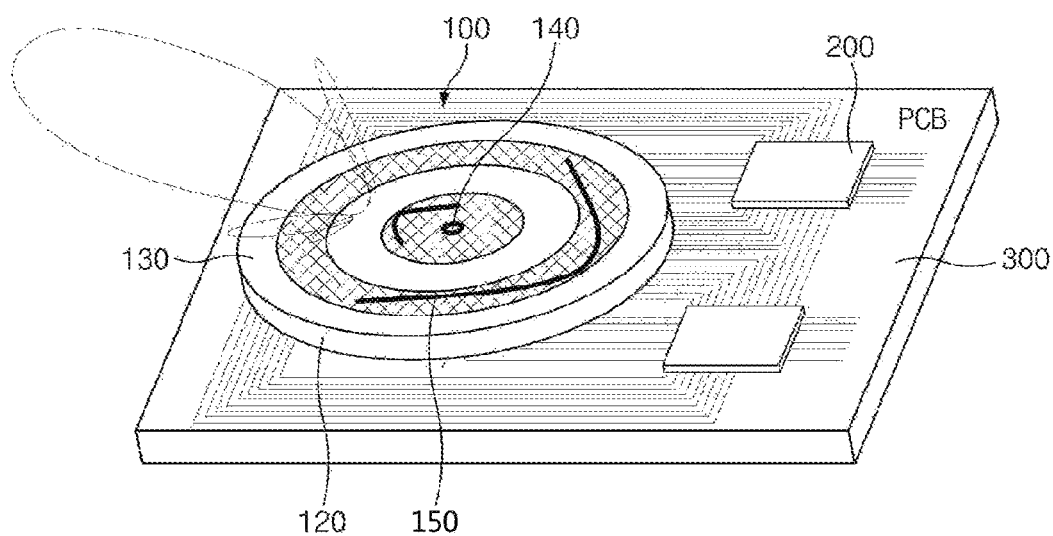
FIG. 7 is a diagram illustrating an example of implementing a semiconductor plasma antenna apparatus according to the present disclosure.

FIG. 7 is a diagram illustrating an example of implementing a semiconductor plasma antenna apparatus according to the present disclosure on a PCB substrate.

As shown in FIG. 7, the semiconductor plasma antenna apparatus according to the present disclosure may implement a cell array unit 100 by combining a plasma cell on a semiconductor wafer.

A semiconductor plasma cell may be configured of a semiconductor plasma reflector 150, an interconnection layer 120, a silicon wafer 130 and a feed unit 140. At this time, the semiconductor plasma cell does not have a ground plane.

Thus, the semiconductor plasma antenna apparatus may use a PCB substrate 300 for mounting the driver circuit unit 200 as a ground plane of the semiconductor plasma cell.

In detail, a plasma cell may be combined on the semiconductor wafer through a bonding wire method, and the semiconductor wafer may be connected to the PCB substrate 300 by applying a backside contact method and a silicon interposer technology to a semiconductor process. At this time, when the semiconductor wafer is connected to the PCB substrate 300, pins that should be connected to the ground among unit cells of the plasma cell may be shared with the ground plane of the driver circuit unit 200 mounted on the PCB substrate 300, so that the PCB substrate 300 may be operated as a ground plane of the semiconductor plasma cell.

In this case, a back lob during the operation of antenna may be reduced, and it is possible to improve a gain and a directivity of the antenna.

According to the present disclosure, the cell pattern may be configured by using the predefined PIN diode cell so that it is possible to reduce the complexity of the routing and increase the performance of the antenna. In addition, it is possible to control the pattern without a configuration of complicated circuit, by driving the cell array of the semiconductor plasma antenna using the DC-DC converter, to efficiently control the plasma density of the diode due to the constant current control characteristic, and to obtain the variable frequency characteristic of the semiconductor plasma antenna by dividing the cell array into a single block or a plurality of blocks.

In addition, the present disclosure may use the PCB for mounting the driver circuit as the ground plane of the semiconductor plasma cell and may reduce the back lob during the operation of antenna, thereby improving the gain and the directivity of the antenna.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A semiconductor plasma antenna apparatus comprising:
   a cell array unit in which a plurality of PIN diode cells are arranged, and in which a cell pattern is formed by using a predefined PIN diode cell among the plurality of PIN diode cells; and
   a driver circuit unit configured to control a drive of the predefined PIN diode cell, the driver circuit unit comprising a DC-DC converter driving a diode load of the cell pattern by applying an output voltage to the predefined PIN diode cell corresponding to the cell pattern formed in the cell array unit, and a constant current controller controlling a plasma concentration of the predefined PIN diode cell by controlling a constant current for the diode load of the cell pattern,
   where the cell array unit comprises a dummy pattern which is formed in an area excluding the cell pattern formed by using the predefined PIN diode cell, and the dummy pattern is connected to ground, and
   wherein when a plurality of cell patterns are overlapped with each other, an intrinsic area of a first PIN diode constituting a first pattern among the plurality of cell patterns and an intrinsic area of a second PIN diode constituting a second pattern among the plurality of cell patterns are implemented to be shared with each other.

2. The semiconductor plasma antenna apparatus of claim 1, wherein the predefined PIN diode cell is connected in series in the cell pattern.

3. The semiconductor plasma antenna apparatus of claim 1, wherein the predefined PIN diode cell is connected in parallel in the cell pattern.

4. The semiconductor plasma antenna apparatus of claim 1, wherein, when a single cell pattern is divided into multiple patterns to configure a plurality of diode loads, the number of the PIN diode cells of the plurality of PIN diode cells configuring each diode load is adjusted according to a type of the DC-DC converter.

5. The semiconductor plasma antenna apparatus of claim 1, wherein the driver circuit unit further comprises a switching unit that intermits a signal between the cell pattern and the DC-DC converter and a signal between the cell pattern and the constant current controller.

6. The semiconductor plasma antenna apparatus of claim 5, wherein, when the plurality of cell patterns are formed in the cell array unit, the switching unit comprises a switch corresponding to each cell pattern.

7. The semiconductor plasma antenna apparatus of claim 5, wherein, when a single cell pattern is divided into multiple patterns to configure a plurality of diode loads, the switching unit comprises a switch corresponding to each of the multiple patterns into which the single cell pattern has been divided.

8. The semiconductor plasma antenna apparatus of claim 7, wherein a length of a corresponding cell pattern is adjusted according to an operation of the switch corresponding to each of the divided patterns.

9. The semiconductor plasma antenna apparatus of claim 5, wherein the switching unit comprises a logic control circuit that controls an input and output of the plurality of signals.

10. The semiconductor plasma antenna apparatus of claim 1, wherein the driver circuit unit is mounted on a PCB substrate, and the cell array unit shares a ground plane of the PCB substrate.

* * * * *